United States Patent
Rofougaran

(10) Patent No.: US 8,198,714 B2
(45) Date of Patent: *Jun. 12, 2012

(54) METHOD AND SYSTEM FOR CONFIGURING A TRANSFORMER EMBEDDED IN A MULTI-LAYER INTEGRATED CIRCUIT (IC) PACKAGE

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 190 days.

This patent is subject to a terminal disclaimer.

(21) Appl. No.: 12/057,714

(22) Filed: Mar. 28, 2008

(65) Prior Publication Data

US 2009/0243767 A1    Oct. 1, 2009

(51) Int. Cl.
- *H01L 23/02* (2006.01)
- *H01L 23/12* (2006.01)
- *H01L 23/053* (2006.01)
- *H01L 23/48* (2006.01)
- *H01L 23/52* (2006.01)
- *H01L 29/40* (2006.01)

(52) U.S. Cl. ........ 257/678; 257/700; 257/701; 257/758; 257/778; 257/E23.036; 361/236; 361/836

(58) Field of Classification Search .................. 257/678, 257/758, 778, 779, 780, 700, 701, E23.036; 334/59; 73/862.339; 361/236, 836
See application file for complete search history.

(56) References Cited

U.S. PATENT DOCUMENTS

| | | | |
|---|---|---|---|
| 3,532,986 A * | 10/1970 | Gelushia et al. | 455/78 |
| 4,785,345 A * | 11/1988 | Rawls et al. | 257/531 |
| 5,003,622 A | 3/1991 | Ma et al. | |
| 5,015,972 A | 5/1991 | Cygan et al. | |
| 5,619,121 A * | 4/1997 | Trainor | 323/256 |
| 5,798,567 A | 8/1998 | Kelly et al. | |
| 5,861,853 A | 1/1999 | Haub et al. | |
| 5,914,873 A * | 6/1999 | Blish, II | 363/147 |
| 6,462,976 B1 * | 10/2002 | Olejniczak et al. | 363/147 |
| 6,801,114 B2 | 10/2004 | Yang et al. | |

(Continued)

FOREIGN PATENT DOCUMENTS

JP    403019358    1/1991

OTHER PUBLICATIONS

Perndl, "Monolithic Microwave Integrated Circuits in SiGe:C Bipolar Technology" Dissertation, Nov. 2004.

*Primary Examiner* — Teresa M Arroyo
(74) *Attorney, Agent, or Firm* — Farjami & Farjami LLP

(57) ABSTRACT

Aspects of a method and system for configuring a transformer embedded in a multi-layer integrated circuit package are provided. In this regard, a windings ratio of a transformer embedded in a multi-layer IC package bonded to an IC may be configured, via logic, circuitry, and/or code in the IC, based on signal levels at one or more terminals of the transformer. The transformer may comprise a plurality of inductive loops fabricated in transmission line media. The integrated circuit may be flip-chip bonded to the multi-layer package. The IC may comprise a signal strength indicator enabled to measure signal levels input to or output by the transformer. The windings ratio may be configured via one or more switches in the IC and/or in the multi-layer package. The IC and/or the multi-layer package may comprise ferromagnetic material which may improve magnetic coupling of the transformer.

20 Claims, 6 Drawing Sheets

U.S. PATENT DOCUMENTS

| | | |
|---|---|---|
| 6,809,581 B2 | 10/2004 | Rofougaran et al. |
| 6,848,178 B2 * | 2/2005 | Kondo et al. .................. 29/852 |
| 7,054,279 B2 * | 5/2006 | Robinson et al. ............. 370/285 |
| 7,081,800 B2 | 7/2006 | He et al. |
| 7,247,932 B1 | 7/2007 | Lin et al. |
| 7,427,977 B2 * | 9/2008 | Park et al. ..................... 345/102 |
| 7,880,677 B2 | 2/2011 | Rofougaran |
| 2002/0039026 A1 * | 4/2002 | Stroth et al. .................. 324/509 |
| 2002/0047601 A1 * | 4/2002 | Shannon et al. .............. 315/224 |
| 2003/0142513 A1 * | 7/2003 | Vinciarelli ..................... 363/17 |
| 2003/0161164 A1 * | 8/2003 | Shannon et al. ................ 363/40 |
| 2004/0075499 A1 * | 4/2004 | Dupuis et al. ................ 330/252 |
| 2004/0095277 A1 * | 5/2004 | Mohamadi ............. 343/700 MS |
| 2004/0101312 A1 * | 5/2004 | Cabrera ........................ 398/172 |
| 2004/0150554 A1 | 8/2004 | Stenger et al. |
| 2004/0201526 A1 | 10/2004 | Knowles et al. |
| 2004/0207504 A1 | 10/2004 | Yang et al. |
| 2004/0222506 A1 | 11/2004 | Wei et al. |
| 2005/0212642 A1 * | 9/2005 | Pleskach et al. .............. 336/200 |
| 2005/0270135 A1 * | 12/2005 | Chua et al. .................... 336/192 |
| 2006/0091958 A1 * | 5/2006 | Bhatti et al. .................. 330/295 |
| 2006/0152911 A1 * | 7/2006 | Humbert et al. .............. 361/782 |
| 2006/0244527 A1 * | 11/2006 | Tsuruya ........................ 330/105 |
| 2006/0267717 A1 | 11/2006 | Posamentier |
| 2007/0139112 A1 * | 6/2007 | Bocock et al. ................ 330/253 |
| 2007/0205748 A1 * | 9/2007 | Abou ............................ 324/100 |
| 2008/0048760 A1 | 2/2008 | El Rai |
| 2008/0049373 A1 * | 2/2008 | Ikeda et al. ................... 361/231 |
| 2008/0284512 A1 * | 11/2008 | Paul et al. ..................... 330/253 |
| 2008/0291115 A1 | 11/2008 | Doan et al. |
| 2009/0046489 A1 * | 2/2009 | Yoshimura et al. ........... 363/123 |
| 2009/0153260 A1 | 6/2009 | Rofougaran |
| 2009/0153421 A1 | 6/2009 | Rofougaran et al. |
| 2009/0153427 A1 | 6/2009 | Rofougaran |
| 2009/0156157 A1 | 6/2009 | Rofougaran et al. |
| 2009/0189064 A1 * | 7/2009 | Miller et al. .................. 250/282 |
| 2009/0243535 A1 * | 10/2009 | Erdmann et al. .............. 318/813 |
| 2009/0243741 A1 | 10/2009 | Rofougaran |
| 2009/0243749 A1 | 10/2009 | Rofougaran |
| 2010/0052839 A1 * | 3/2010 | Mertens et al. ................ 336/232 |

* cited by examiner

METHOD AND SYSTEM FOR CONFIGURING A TRANSFORMER EMBEDDED IN A MULTI-LAYER INTEGRATED CIRCUIT (IC) PACKAGE

CROSS-REFERENCE TO RELATED APPLICATIONS/INCORPORATION BY REFERENCE

Not Applicable

FIELD OF THE INVENTION

Certain embodiments of the invention relate to signal processing. More specifically, certain embodiments of the invention relate to a method and system for configuring a transformer embedded in a multi-layer IC package.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for configuring a transformer embedded in a multi-layer IC package, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for configuring a transformer embedded in a multi-layer IC package. In various embodiments of the invention, a windings ratio of a transformer embedded in a multi-layer IC package may be configured, via logic, circuitry, and/or code in an IC bonded to the package, based on signal levels at a winding of the transformer. The transformer may comprise a plurality of inductive loops fabricated in a plurality of metal layers of the multi-layer package. The loops may be fabricated in transmission line media such as microstrip and/or stripline. The integrated circuit (IC) may be flip-chip bonded to the multi-layer package and may comprise one or more amplifiers communicatively coupled to the transformer. The integrated circuit may comprise a signal strength indicator enabled to measure signal levels at a primary and/or secondary winding of the transformer. A windings ratio of the transformer may be configured via one or more switches which may comprise active devices in the IC and/or micro-electromechanical (MEMS) switches in the multi-layer package. The IC and/or the multi-layer package may comprise ferromagnetic material which may, for example, improve magnetic coupling of the transformer.

Figure 1A:
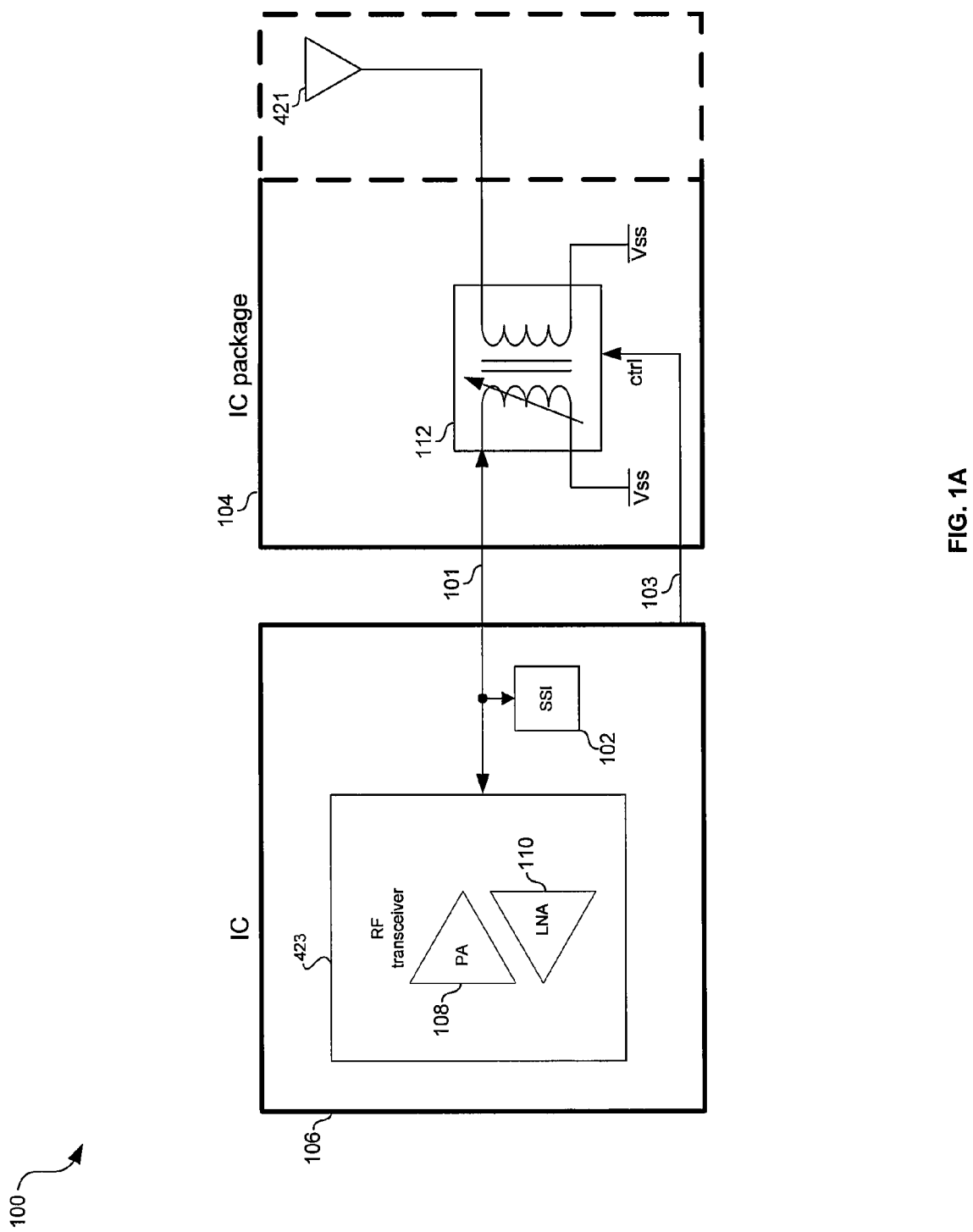
FIG. 1A is a diagram of a hybrid circuit comprising a transformer embedded in a multi-layer integrated circuit (IC) package, in accordance with an embodiment of the invention.

FIG. 1A is a diagram of a hybrid circuit comprising a transformer embedded in a multi-layer integrated circuit (IC) package, in accordance with an embodiment of the invention. Referring to FIG. 1A there is shown a hybrid circuit 100 (may also be referred to as a hybridized circuit, or a hybrid or hybridized package) comprising an IC 106 and a multi-layer IC package 104. The IC 106 may be flip chip bonded (also referred to as bump bonded) to the multi-layer IC package. The IC may comprise a transceiver 423 and a signal strength indicator (SSI) 102. The multi-layer IC package 104 may comprise a transformer 112 and an antenna 421. In various other embodiments of the invention, the antenna 421 may be separate from the hybrid circuit 100. Although a single transceiver 423 is illustrated, the invention is not so limited. Accordingly, a separate transmitter and/or receiver may be utilized without departing from the scope of the invention.

The IC 106 may comprise suitable logic, circuitry, and/or code for performing one or more functions associated with transmitting and/or receiving RF signals. In this regard, the IC 106 may comprise all or a portion of the system 420 described with respect to FIG. 4. The IC 106 may utilize a transformer embedded in the multi-layer integrated circuit package 104 for transmitting and/or receiving RF signals. In this regard, the transformer 112 may enable coupling signals to be transmitted from the transceiver 423 to the antenna 421 and coupling signals received by the antenna 421 to the transceiver 423. In various embodiments of the invention, the windings ratio of the transformer may be configurable. In this regard, the IC 106 may comprise suitable logic, circuitry and/or code for configuring the transformer 112.

The SSI 102 may comprise suitable logic, circuitry, and/or code that may enable determining signal strength. In this regard, the SSI 102 may, for example, be enabled to measure current, voltage, and/or power of the signal 101. Additionally, the SSI 102 may be enabled to convey measurement results to other portions of the IC 106. In this regard, the SSI 102 may output one or more digital and/or analog signals representative of the current, voltage, and/or power of the signal 101. The one or more signals output by the SSI 102 may be utilized by, for example, the processor 425 described with respect to FIG. 4, to generate a control signal 103.

The multi-layer IC package 104 may comprise one or more layers of metal and/or insulating material. In this regard, the multi-layer IC package 104 may be fabricated in a manner similar to or the same as the IC 106. Accordingly, circuit elements, such as resistors, inductors, capacitors, transmission lines, switches, and antennas, may be fabricated in one or more metal layers of the multi-layer package 104. In one exemplary embodiment of the invention, one or more switching elements and one or more transformers may be fabricated in the multi-layer IC package 104. In this manner, a configurable transformer 112 may be realized wherein opening/closing the switches may alter the windings ratio of the transformer 112. In other embodiments of the invention, one or more switching elements which may control the windings ratio of the transformer may be fabricated in the IC 106.

The transformer 112 may comprise two or more windings and a core. In various embodiments of the invention, the number of loops in the primary and/or secondary winding may be configurable. In this manner, the transformer 112 may enable adjusting an impedance seen by signals communicatively coupled to the transformer 112. In this manner, voltage swings at an amplifier input and/or an amplifier output may be maintained within determined limits. In various embodiments of the invention, the core of the transformer 112 may comprise ferromagnetic material.

In operation, the transceiver may comprise a power amplifier (PA) 108 which may output the signal 101 to the antenna 421 via the transformer 112. In this regard, altering the windings ratio of the transformer 112 may enable maintaining voltage and/or current levels of the signal 101 within determined limits. In this manner, damage to circuitry in the IC 106 and/or the multi-layer package 104 resulting from large voltage swings of the signal 101 may be prevented.

In operation, the transceiver 423 may comprise a low noise amplifier (LNA) 110 which may receive the signal 101 from the antenna 421 via the transformer 112. In this regard, altering the windings ratio of the transformer 112 may enable maintaining voltage and/or current levels of the signal 101 within determined limits. In this manner, damage to circuitry in the IC 106, such as the LNA 110, and/or in the multi-layer package 104 resulting from large voltage swings of the signal 101 may be prevented.

Figure 1B:
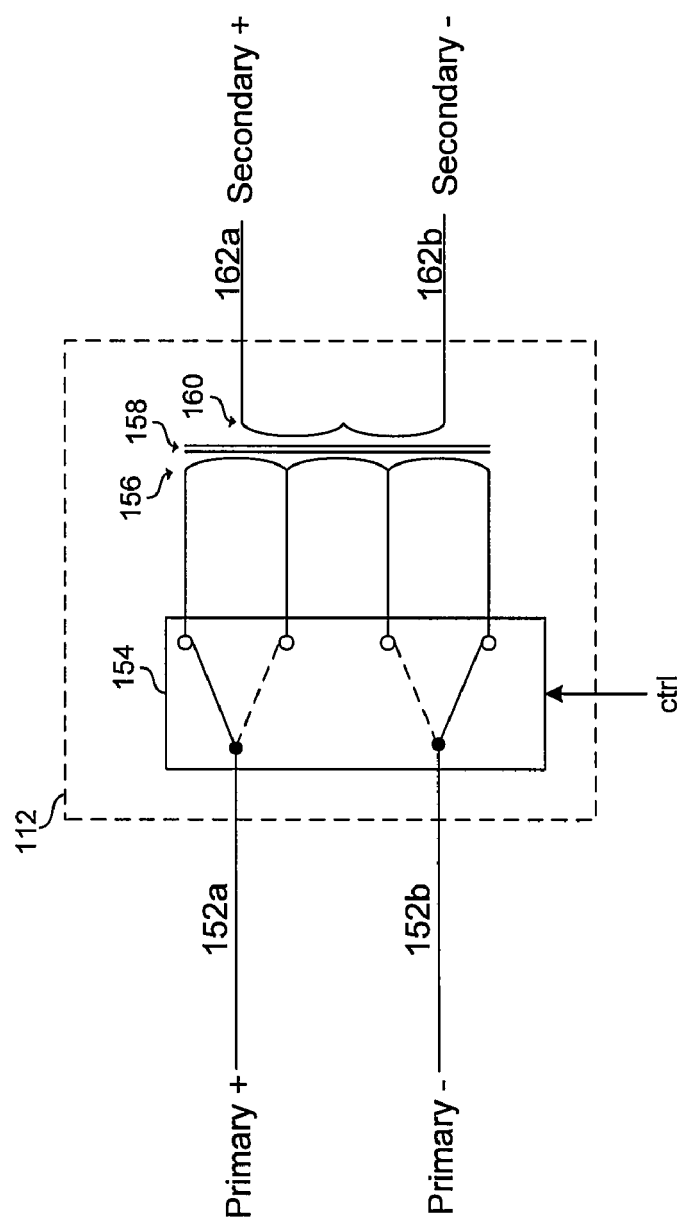
FIG. 1B is a diagram of a transformer with configurable windings ratio, in accordance with an embodiment of the invention.

FIG. 1B is a diagram of a transformer with configurable windings ratio, in accordance with an embodiment of the invention. Referring to FIG. 1B there is shown a transformer 112 with terminals 152a, 152b, 162a, and 162b, a switch network 154, a first winding 156, a transformer core 158, and a second winding 160.

The terminals 152a and 152b may be inputs and/or outputs to the first winding 156. In the exemplary embodiment of the invention depicted, the number of turns (also referred to as loops) between terminals 152a and 152b may be variable. The terminals 162a and 162b may be the inputs and/or outputs to the second winding 160. In the exemplary embodiment of the invention depicted, the number of turns (loops) between the terminals 162a and 162b may be fixed.

The switch network 154 may comprise suitable logic, circuitry, and/or code for communicatively coupling the terminals 152a and 152b to one or more turns of the first winding 156. The switch network 154 may be controlled via one or more control signals from, for example, the processor 425 and/or the baseband processor 427 described with respect to FIG. 4. In the exemplary embodiment of the invention depicted, the switches, within the switch network 154, in the position indicated by the solid lines may result in three turns between the terminals 152a and 152b, whereas the switches in the position indicated by the dashed lines may result in one turn between the terminals 152a and 152b. In the exemplary embodiment of the invention depicted, the winding 160 has two turns. Thus, the windings ratio is configurable between 3:2 and 1:2 (first winding: second winding).

The transformer core 518 may comprise a material suitable for concentrating the flux generated by one winding to induce a current in the other winding. In various exemplary embodiments of the invention, the core may comprise ferromagnetic material within the multi-layer IC package 104.

In various embodiments of the invention, the first winding 156 may be the primary winding or the secondary winding, and the second winding 160 may be the secondary winding or the primary winding. Additionally, both windings may comprise a variable number of turns configured via one or more switch networks.

In operation, the control signal may configure the switch network 154 based on, for example, voltage and/or current levels at the terminals 152a, 152b and terminals 162a, 162b. For example, for the terminal 152a, 152b may be communicatively coupled to a power amplifier and the terminals 162a, 162b may be coupled to an antenna. Accordingly, the switches may be in the dashed line configuration for high output power and the switches may be in the solid line configuration for low PA output power. In this manner, the voltage swing at the output of the PA may be maintained, for example, within safe levels so as not to damage CMOS circuitry.

Figure 2A:
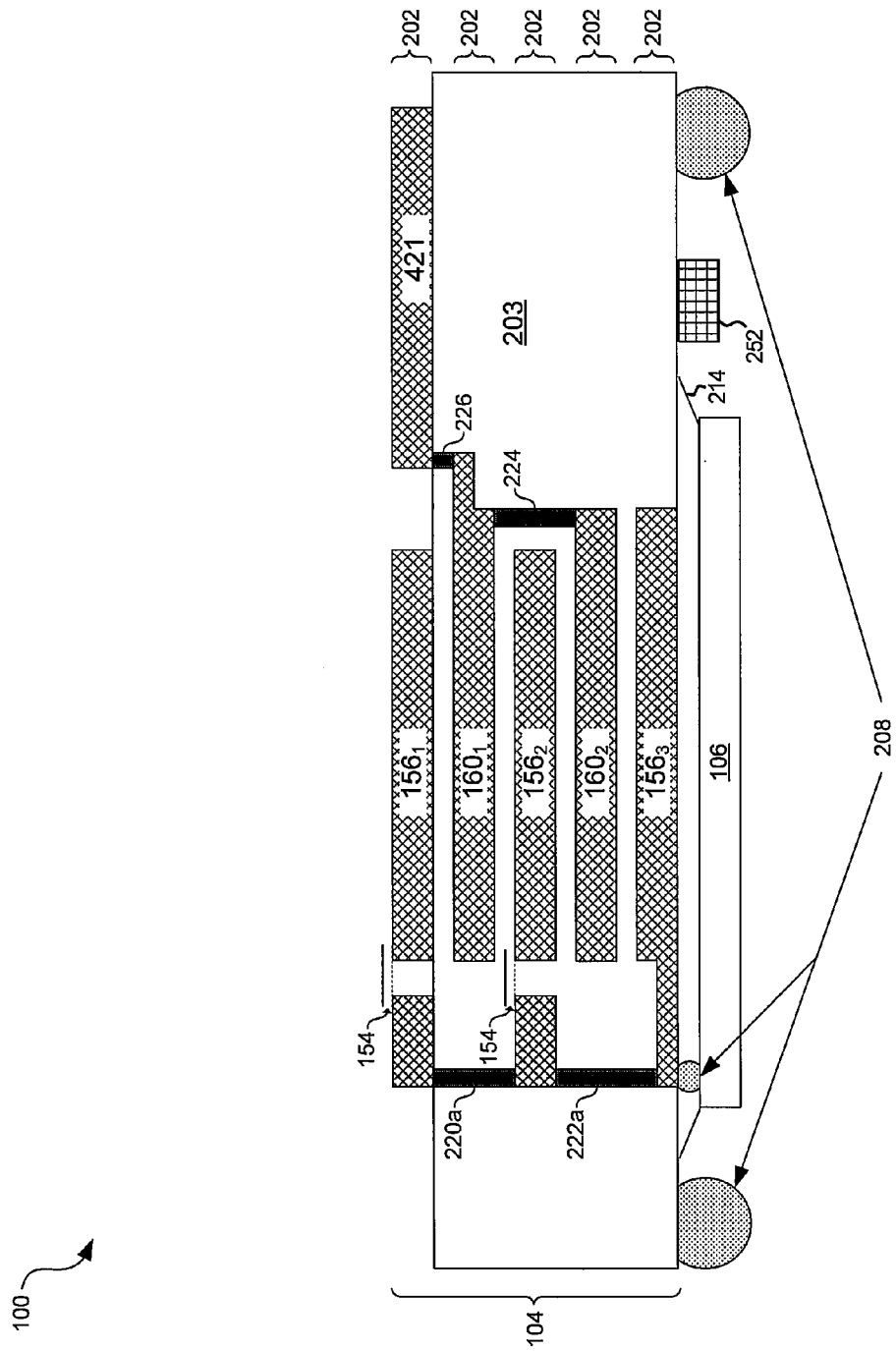
FIG. 2A is a diagram illustrating a cross sectional view of a multi-layer package with embedded transformer, in accordance with an embodiment of the invention.

FIG. 2A is a diagram illustrating a cross sectional view of a multi-layer package with embedded transformer, in accordance with an embodiment of the invention. Referring to FIG. 2, there is shown a hybrid circuit 100 comprising an IC 106 and a multi-layer IC package 104. The multi-layer IC package 104 may comprise an insulating material 203; metal layers 202; vias 220a, 220b(not shown), 222a, 222b(not shown), 224, and 226; and MEMS switches 154. Additionally, in various embodiments of the invention, the multi-layer IC package 104 may comprise one or more layers and/or areas of ferromagnetic and/or ferrimagnetic material. The IC 106 may be coupled to the multi-layer IC package 104, and the package 104 to a PCB (not shown), via solder balls 208. Surface mount component(s) 252 may be mounted to the multi-layer IC package 104, and thermal epoxy 214 may be pressed between the IC 106 and the multi-layer IC package 104.

The IC 106 may be as described with respect to FIG. 1. Additionally, the IC 106 may be flip-chip bonded (also referred to as bump bonded) to the multi-layer IC package 104 utilizing solder balls (e.g. solder balls 208 as described with respect to FIG. 2A below). In this manner, wire bonds connecting the IC 106 to the multi-layer IC package 104 may be eliminated, reducing and/or eliminating stray inductances due to wire bonds. In addition, the thermal conductance out of the IC 106 may be greatly improved utilizing the solder balls 208 and the thermal epoxy 214. The thermal epoxy 214 may be electrically insulating but thermally conductive to allow for thermal energy to be conducted out of the IC 106 to the much larger thermal mass of the multilayer package 104.

The solder balls 208 may comprise spherical balls of metal to provide electrical, thermal and physical contact between the IC 106 and the multi-layer IC package 104. In making the contact with the solder balls 208, the IC 106 may be pressed with enough force to squash the metal spheres somewhat, and may be performed at an elevated temperature to provide suitable electrical resistance and physical bond strength. The solder balls 208 may also be utilized to provide electrical, thermal and physical contact between the multi-layer IC package 104 and a printed circuit board comprising other parts of, for example, the wireless system 420 described with respect to FIG. 4.

The surface mount device(s) 252 may comprise discrete circuit element(s) such as resistors, capacitors, inductors, and diodes, for example. The surface mount device(s) 252 may be soldered to the multi-layer IC package 104 to provide electrical contact. In various embodiments of the invention, additional surface mount elements or no surface mount elements may be coupled to the multi-layer IC package 104.

Figure 4:
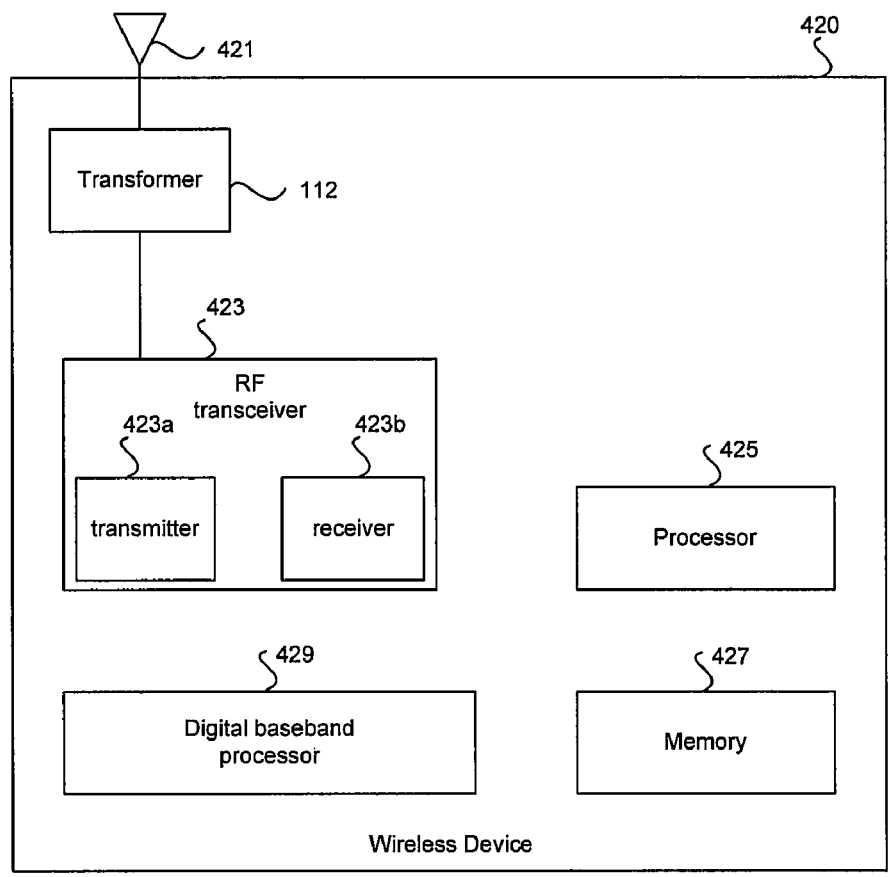
FIG. 4 is a block diagram illustrating an exemplary wireless device, in accordance with an embodiment of the invention.

In an exemplary embodiment of the invention, the metal layer 202, may each comprise a deposited metal layer utilized to delineate the two transformer windings 156 (comprised of loops $156_1$, $156_2$, and $156_3$) and 160 (comprised of loops $160_1$, $160_2$) described with respect to FIG. 1B and the antenna 421 described with respect to FIG. 4. In this regard, the metal layer 202 may be deposited in shapes and/or sizes which may enable varying characteristics of the transformer 112 and the antenna 421.

In an exemplary embodiment of the invention, the vias 220a, 220b(not shown), 222a, 222b (not shown) may comprise metal and/or other conductive material(s) which may communicatively couple the metal layers 202 to one another and to the solder balls 208. In this manner, signals may be conveyed to and/or from the transformer windings 156 and 160, the IC 106, and the antenna 421. In the exemplary embodiment of the invention depicted, vias 220a 222a may communicatively couple positive terminals of loops $156_1$, $156_2$, and $156_3$ and vias 220b and 222b (not shown) may couple negative terminals of loops $156_1$, $156_2$, and $156_3$. Similarly, via 224 may connect a negative terminal of loop $160_1$ to a positive terminal of loop $160_2$. In various other embodiments of the invention, additional and/or alternative vias may communicatively couple the transformer loops to each other and/or to the IC 106.

In an exemplary embodiment of the invention, the switch network 154 described with respect to FIG. 1B may be implemented as MEMS switches in the multi-layer IC package 104. In this regard, the MEMS switches 154 may close when, for example a magnetic field is induced on a switch terminal. In this regard, the MEMS switches 154 may each comprise a thin conductive element or film which in the open position is suspended above a switch terminal (as indicated by the solid lines in FIG. 2) and in the closed position is in contact with a switch terminal (as indicated by the dashed lines in FIG. 2). Accordingly, energizing the terminal, for example, may generate an attracting force that draws the element of film into contact with the terminal. In various other embodiments of the invention, the transformer may be configured via one or more switches integrated on the IC 106.

In operation, the IC 106 and associated multi-layer IC package 104 may be utilized to transmit and/or receive RF signals. The IC 106 may be electrically coupled to the antenna 421 embedded on and/or within the multi-layer IC package 104 via a configurable transformer embedded on and/or within the multi-layer IC package 104. The windings ratio of the transformer may be configured via the switch network 154. In this regard, when both switches are closed the windings ratio may be 3:2, when one switch is open the windings ratio may be 2:2, and when both switches are open the windings ratio may be 1:2. Logic, circuitry, and/or code in the IC 106 may control the switches 154. In various embodiments of the invention, additional devices (e.g., capacitors, inductors, resistors) may be integrated into the multi-layer IC package without deviating from the scope of the present invention. Additionally, although a transformer comprising five loops is depicted, various exemplary embodiments of the invention may comprise any number of metal layers, transformer loops, and/or switching elements without deviating from the scope of the invention.

Figure 2B:
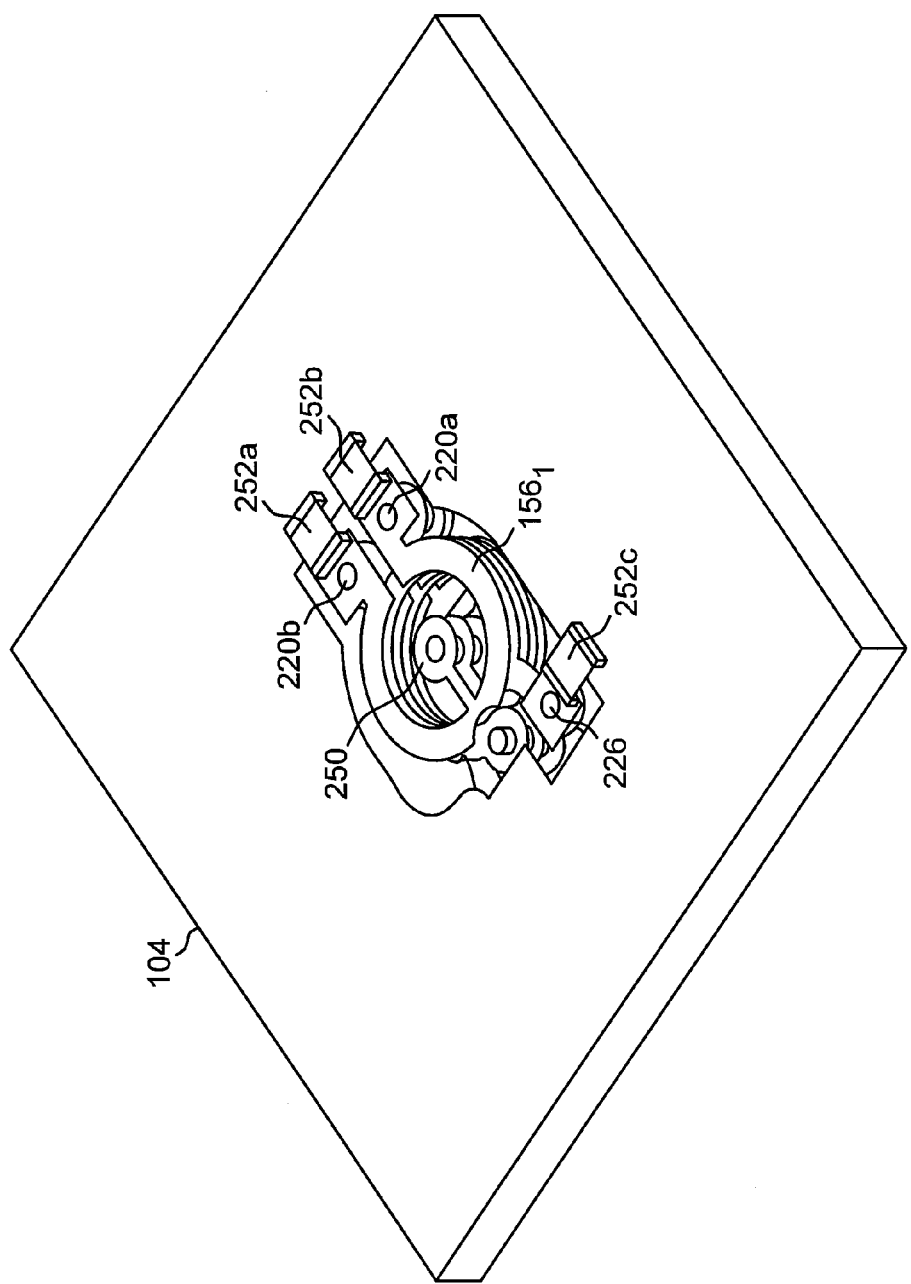
FIG. 2B is an exemplary top view of a transformer embedded in a multi-layer IC package, in accordance with an embodiment of the invention.

FIG. 2B is an exemplary top view of a transformer embedded in a multi-layer IC package, in accordance with an embodiment of the invention. Referring to FIG. 2B there is shown a multi-layer IC package 104, with embedded transformer. In this regard, FIG. 2B may be an alternate view of the transformer 112 described with respect to FIGS. 1A, 1B and 2A. Shown in FIG. 2B, but not depicted in FIG. 2A, are the terminal 250 and the capacitors 252a, 252b, and 252c.

The terminal 250 may provide a tap into the winding 156 such that a DC bias may be applied to the winding. In this regard, a DC bias applied to the center of the winding 156 may be utilized, for example, when a balanced (differential) signal is communicatively coupled to the winding 156.

The capacitors 252a, 252b, 252c may be bypass capacitors to ground, which may be communicatively coupled to the terminals 152a and 152b of the winding 156 and communicatively coupled to the positive terminal 226 of the winding 160. The antenna 421 of FIG. 2A is not shown in FIG. 2B.

Figure 3:
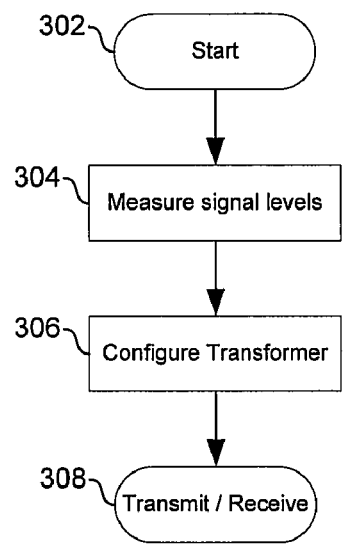
FIG. 3 is a flow chart illustrating exemplary steps for configuring a transformer embedded in a multi-layer IC package, in accordance with an embodiment of the invention.

FIG. 3 is a flow chart illustrating exemplary steps for configuring a transformer embedded in a multi-layer IC package, in accordance with an embodiment of the invention. Referring to FIG. 3, subsequent to start step 302, the exemplary steps may advance to step 304. In step 304, signal levels at the transformer may be measured. In an exemplary embodiment of the invention, an output of a power amplifier, such as the PA 108 described with respect to FIG. 1A, may be coupled to a primary winding of the transformer. Accordingly, the voltage across the primary winding may be measured. In another exemplary embodiment of the invention, a primary winding may be coupled to an antenna such as the antenna 421 described with respect to FIG. 4, and a secondary winding may be coupled to a low noise amplifier, such as the LNA 110 described with respect to FIG. 1A. Accordingly, voltage across the secondary winding may be measured. Measurements performed in step 304 may be performed by a SSI such as the SSI 102 described with respect to FIG. 1A. Additionally, measurement results may be conveyed to, for example, a memory and/or a processor, such that one or more control signals may be generated for configuring the transformer. Subsequent to step 304, the exemplary steps may advance to step 306. In step 306, the windings ratio of the transformer may be adjusted such that the measured voltage levels are within determined limits. In this regard, in instances that the voltage across primary winding is too high, a lower windings ratio may be selected. Conversely, in instances that the voltage across the primary winding is too low, a higher windings ratio may be selected. Subsequent to step 306, the exemplary steps may advance to step 308. In step 308, signals may be received from and/or transmitted to an antenna via the configured transformer.

FIG. 4 is a block diagram illustrating an exemplary wireless device, in accordance with an embodiment of the invention. Referring to FIG. 4, there is shown a wireless device 420 that may comprise an RF transceiver 423, a digital baseband processor 429, a processor 425, and a memory 427. The transceiver 423 may comprise a receiver 423b and a transmitter 423a. An antenna 421 may be communicatively coupled to the RF transceiver 423 via the transformer 112. The wireless device 420 may be operated in a system, such as the cellular network and/or digital video broadcast network, for example.

In an exemplary embodiment of the invention, the antenna 421 may comprise one or more antenna elements which may be coupled and/or decoupled via one or more switching elements. In this regard, the antenna 421 may be configured based on factors comprising frequency, polarization, and/or gain. In another exemplary embodiment of the invention, the antenna 421 may be a phased array antenna. In this regard, the directivity of the antenna may be controlled by adjusting the phase(s) of signals communicatively coupled to the antenna.

The RF receiver 423b may comprise suitable logic, circuitry, and/or code that may enable processing of received RF signals. The RF receiver 423b may enable receiving RF signals in a plurality of frequency bands. For example, the RF receiver 423b may enable receiving signals in extremely high frequency (e.g., 60 GHz) bands. The receiver 423b may be enabled to receive, filter, amplify, down-convert, and/or perform analog to digital conversion. The RF receiver 423b may down convert a received RF signal. In this regard, the RF receiver 423b may perform direct down conversion of the received RF signal to a baseband or may convert the received RF signal to an intermediate frequency (IF). In various embodiments of the invention, the receiver 423b may perform quadrature down-conversion where in-phase components and quadrature phase components may be processed in parallel. The receiver 423b may be enabled to receive signals via the transformer 112, which may be configurable and provide a means of controlling signal levels at its primary and/or secondary windings. In various embodiments of the invention, the wireless device 420 may comprise a plurality of the receivers 423b and may thus support multiple frequency bands and or simultaneous reception of signals in the same frequency band.

The digital baseband processor 429 may comprise suitable logic, circuitry, and/or code that may enable processing and/or handling of baseband signals. In this regard, the digital baseband processor 429 may process or handle signals received from the RF receiver 423b and/or signals to be transferred to the RF transmitter 423a, when the RF transmitter 423a is present, for transmission to the network. The digital baseband processor 429 may also provide control and/or feedback information to the RF receiver 423b and to the RF transmitter 423a based on information from the processed signals. In this regard, the baseband processor 429 may provide one or more control signals for configuring the transformer 112 via one or more switching elements. The digital baseband processor 429 may communicate information and/or data from the processed signals to the processor 425 and/or to the memory 427. Moreover, the digital baseband processor 429 may receive information from the processor 425 and/or to the memory 427, which may be processed and transferred to the RF transmitter 423a for transmission to the network.

The RF transmitter 423a may comprise suitable logic, circuitry, and/or code that may enable processing of RF signals for transmission. The transmitter 423a may be enabled to transmit signals via the transformer 112, which may be configurable and provide a means of controlling signal levels at its primary and/or secondary windings. The RF transmitter 423a may enable transmission of RF signals in a plurality of frequency bands. For example, the RF transmitter 423a may enable transmitting signals in cellular frequency bands. Each frequency band supported by the RF transmitter 423a may have a corresponding front-end circuit for handling amplification and up conversion operations, for example. In this regard, the RF transmitter 423a may be referred to as a multi-band transmitter when it supports more than one frequency band. In another embodiment of the invention, the wireless device 420 may comprise more than one RF transmitter 423a, wherein each of the RF transmitter 423a may be a single-band or a multi-band transmitter.

In various embodiments of the invention, the RF transmitter 423a may perform direct up conversion of the baseband signal to an RF signal. In some instances, the RF transmitter 423a may enable digital-to-analog conversion of the baseband signal components received from the digital baseband processor 429 before up conversion. In other instances, the RF transmitter 423a may receive baseband signal components in analog form.

The processor 425 may comprise suitable logic, circuitry, and/or code that may enable control and/or data processing operations for the wireless device 420. The processor 425 may be utilized to control at least a portion of the RF receiver 423b, the RF transmitter 423a, the digital baseband processor 429, and/or the memory 427. In this regard, the processor 425 may generate at least one signal for controlling operations within the wireless device 420. In this regard, the baseband processor 429 may provide one or more control signals for configuring the transformer 112 via one or more switching elements. The processor 425 may also enable executing of applications that may be utilized by the wireless device 420. For example, the processor 425 may execute applications that may enable displaying and/or interacting with content received via cellular transmission signals in the wireless device 420.

The memory 427 may comprise suitable logic, circuitry, and/or code that may enable storage of data and/or other information utilized by the wireless device 420. For example, the memory 427 may be utilized for storing processed data generated by the digital baseband processor 429 and/or the processor 425. The memory 427 may also be utilized to store information, such as configuration information, that may be utilized to control the operation of at least one block in the wireless device 420. For example, the memory 427 may comprise information necessary to configure the transformer 112. In this regard, the memory may store control and/or configuration information for configuring the windings ratio of the transformer 112 via one or more switching elements.

Aspects of a method and system for configuring a transformer embedded in a multi-layer integrated circuit package are provided. In various embodiments of the invention, a windings ratio of a transformer, such as the transformer 112, embedded in a multi-layer IC package, such as the IC package 104, may be configured; via logic, circuitry, and/or code in an IC, such as the IC 106; based on signal levels at one or more terminals of the transformer. The transformer 112 may comprise a plurality of inductive loops fabricated in a plurality of metal layers, such as the loops 156 and 160 described with respect to FIG. 2A, of the IC package 104. The loops 156 and/or 160 may be fabricated in transmission line media such as microstrip and/or stripline. The IC 106, may be flip-chip bonded to the IC package and may comprise one or more amplifiers, such as the PA 108 and the LNA 110, communicatively coupled to the transformer 112 and/or a signal strength indicator, such as the SSI 102, enabled to measure signal levels input to or output by the transformer. The windings ratio may be configured via one or more switches, such as the switching element 154, which may comprise active devices in the IC 106 and/or MEMS switches in the multi-layer package 104. The IC 106 and/or the multi-layer package 104 may comprise ferromagnetic material which may improve magnetic coupling of the transformer.

Another embodiment of the invention may provide a machine-readable storage, having stored thereon, a computer program having at least one code section executable by a machine, thereby causing the machine to perform the steps as described herein for configuring a transformer embedded in a multi-layer IC package.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
    in a hybrid circuit comprising an integrated circuit flip-chip bonded to a multi-layer package:
    measuring signal levels along a winding of a transformer embedded in said multi-layer package; and
    adjusting, during operation of said hybrid circuit, a windings ratio of said transformer based on said measured signal levels.

2. The method according to claim 1, comprising measuring said signal levels utilizing a signal strength indicator in said integrated circuit.

3. The method according to claim 1, wherein said winding is communicatively coupled to an output of an amplifier.

4. The method according to claim 1, wherein said winding is communicatively coupled to an input of an amplifier.

5. The method according to claim 1, comprising adjusting said windings ratio of said transformer via one or more switching elements.

6. The method according to claim 5, wherein said one or more switching elements comprise microelectromechanical system (MEMS) switches within and/or on said multi-layer package.

7. The method according to claim 5, wherein said one or more switching elements comprise active devices fabricated within and/or on said integrated circuit.

8. The method according to claim 1, wherein said transformer comprises a plurality of loops fabricated in a plurality of metal layers in said multi-layer integrated circuit package.

9. The method according to claim 8, wherein said loops are fabricated in transmission line media.

10. The method according to claim 1, wherein ferromagnetic material is embedded in said multi-layer package.

11. A system for signal processing, the system comprising:
    a hybrid circuit comprising an integrated circuit flip-chip bonded to a multi-layer package, wherein a transformer is embedded in said multi-layer package and said integrated circuit comprises one or more circuits that enable:
    measuring signal levels along a winding of said transformer; and
    adjustment, during operation of said hybrid circuit, of a windings ratio of said transformer based on said measured signal levels.

12. The system according to claim 11, wherein said one or more circuits is enabled to measure said signal levels utilizing a signal strength indicator in said integrated circuit.

13. The system according to claim 11, wherein said winding is communicatively coupled to an output of an amplifier.

14. The system according to claim 11, wherein said winding is communicatively coupled to an input of an amplifier.

15. The system according to claim 11, wherein said one or more circuits enable adjustment of said windings ratio of said transformer via one or more switching elements.

16. The system according to claim 15, wherein said one or more switching elements comprise microelectromechanical system (MEMS) switches within and/or on said multi-layer package.

17. The system according to claim 15, wherein said one or more switching elements comprise active devices fabricated within and/or on said integrated circuit.

18. The system according to claim 11, wherein said transformer comprises a plurality of loops fabricated in a plurality of metal layers in said multi-layer integrated circuit package.

19. The system according to claim 18, wherein said loops are fabricated in transmission line media.

20. The system according to claim 11, wherein ferromagnetic material is embedded in said multi-layer package.

* * * * *